United States Patent [19]

Uragaki et al.

[11] 4,268,327
[45] May 19, 1981

[54] METHOD FOR GROWING SEMICONDUCTOR EPITAXIAL LAYERS

[75] Inventors: Tamotsu Uragaki, Osaka; Morio Inoue, Takatsuki; Susumu Koike, Kawachinagano; Hitoo Iwasa, Ibaraki, all of Japan

[73] Assignee: Matsushita Electric Industrial Co., Ltd., Kadoma, Japan

[21] Appl. No.: 109,915

[22] Filed: Jan. 7, 1980

[30] Foreign Application Priority Data

Jan. 17, 1979 [JP] Japan .................................. 54-4381

[51] Int. Cl.³ .......................................... H01L 21/208
[52] U.S. Cl. .................................. 148/171; 29/569 L; 29/580; 148/172; 148/173; 148/191
[58] Field of Search ............... 148/171, 172, 173, 191; 29/569 L, 580

[56] References Cited

U.S. PATENT DOCUMENTS

| | | | |
|---|---|---|---|
| 3,365,630 | 1/1968 | Logan et al. | 148/171 X |
| 3,592,704 | 7/1971 | Logan et al. | 148/171 |
| 3,646,406 | 2/1972 | Logan et al. | 148/171 |
| 3,689,330 | 9/1972 | Dosen et al. | 148/171 |
| 3,893,875 | 7/1975 | Watanabe et al. | 148/172 |
| 3,935,039 | 1/1976 | Beppu et al. | 148/173 X |
| 3,948,693 | 4/1976 | Weyrich et al. | 148/173 X |
| 3,951,699 | 4/1976 | Naito et al. | 148/171 |

*Primary Examiner*—G. Ozaki
*Attorney, Agent, or Firm*—Cushman, Darby & Cushman

[57] ABSTRACT

A method for growing semiconductor epitaxial layers for manufacturing semiconductor devices such as light emitting diodes, characterized by
 using a single tub for containing a solution comprising solvent solute and additive, and
 after growing a first epitaxial layer growth by contacting the solution to a semiconductor substrate, evacuating the space in a container containing said semiconductor substrate and said solution tub, thereby removing at least a part of said additive.

4 Claims, 6 Drawing Figures

METHOD FOR GROWING SEMICONDUCTOR EPITAXIAL LAYERS

BACKGROUND OF THE INVENTION

1. Field of the Invention

The present invention relates to an improvement in a method for growing semiconductor epitaxial layers by a liquid phase epitaxial growth.

More particularly, the present invention is concerned with a method for growing semiconductor epitaxial layers on a semiconductor substrate for sequentially forming liquid phase epitaxial growth layers of opposite conductivity types to form a p-n junction inbetween.

2. Description of the Prior Art

A liquid phase epitaxial growth method is generally being used in forming semiconductor epitaxial growth layers such as GaAs, GaP or GaAlAs on a III-V compound semiconductor substrate, and is a fundamental method of manufacturing semiconductor lasers or light emitting diodes.

Hitherto, there have been two sequential epitaxial growth methods for forming semiconductor epitaxial growth layers with p-n junction inbetween on a semiconductor substrate. A first method uses two solution tubs. A first solution tub contains a first solution comprising a solvent such as Ga, In or Sn, a solute of III-V semiconductor such as GaAs, GaP or GaAlAs and an impurity for determining a conductivity type. A second solution tub contains a second solution having similar contents but containing an opposite type impurity to that of the first solution. The epitaxial growth is made by sequential contacts of the first and the second solutions on the substrate.

A second method uses one solution tub containing a semiconductor solution of one conductivity type and after forming a first epitaxial layer by contacting the solution of a first conductivity to the semiconductor substrate, an opposite type impurity is given from gas phase or solid phase to the solution thereby compensating the first conductivity and forming a second epitaxial layer.

FIG. 1 shows an apparatus utilizing the first method using two tubs, wherein a slider 10 is slidably disposed on a holder 5 having a recess 51 for holding a semiconductor substrate 6 therein. The slider 10 comprises two solution tubs 1 and 3, which respectively contain solutions 2 and 4 of opposite conductivity types relative to each other. In such an apparatus, sequential epitaxial growth is made by firstly putting the first solution tub 1 on the substrate 6 and then, by moving the slider 10 to the right, placing the second solution tub 2 on the substrate 6. The abovementioned first conventional method using two tubs has a problem, such that, although impurity concentration controls are easy due to separate semiconductor tubs, the two tubs require a large volume of solution and hence are disadvantageous from both a mass-production and economic view point.

FIG. 2 shows an apparatus utilizing the second method using a single tub, wherein a slider 10 is slidably disposed on a holder 5 having a recess 51 for holding a semiconductor substrate 6 therein. The slider 10 comprises only one semiconductor solution tub 8 which originally contains a semiconductor solution 7 having an impurity therein. In such an apparatus, sequential epitaxial growth is made by firstly contacting the solution 7 of the tub 8 to the substrate 6 thereby forming first epitaxial layer thereon, and secondly adding an opposite type impurity to the solution by, for example, a gas phase, thereby compensating the original impurity and forming a second epitaxial layer of a second conductivity type on the first epitaxial layer. The abovementioned second conventional epitaxial growth method using a single tub has a problem such that, although the mass-productivity and economical aspects are good, a considerable amount of the second impurity is necessary in order to compensate the first impurity contained in the solution. Therefore, the second epitaxial layer necessarily contains a high concentration of impurity, resulting in considerable crystal imperfection and poor light output. The light emitting diode made in accordance with the second method using a single tub has a smaller light output in comparison with that made in accordance with the first method using two tubs.

FIG. 3 is a time graph plotting temperature change of the semiconductor substrate and solution in degrees Celcius against time in an actual manufacturing process for a GaP green light emitting diode utilizing the apparatus of FIG. 2. Details of the manufacturing process are as follows:

A semiconductor solution in the tub 8 is prepared by placing the following material in the tub 8:

Ga (as solvent): 10 g
GaP (polycrystalline; as solute): 350 mg
Te (as impurity of n-type conductivity): 100 μg.

The abovementioned components are preliminarily heated in the tub 8 at the position as shown to the temperature of $T_1 = 1020°$ C. for the time period of $\tau_1 = 30$ min., namely from the time $t_1$ to the time $t_2$, so that the material sufficiently dissolves in the solution. Nitrogen as a recombination center is introduced from a carrier gas comprising $NH_3$ and $H_2$ from the time $t_1$ on. After the preliminary heating of the solution for the time period of $\tau_1$, the solution is contacted with a GaP substrate 6 from the time $t_2$ to the time $t_3$, namely for the time period of $\tau_2 = 20$ min., by sliding the slider 10 to the right. The substrate and the solution are then cooled at a predetermined cooling rate from the time $t_3$ to the time $t_4$, namely for the time period of $\tau_3 = 25$ min., down to the temperature of $T_2 = 920°$ C., thereby growing the first epitaxial layer of n-type conductivity. After forming the n-type first epitaxial layer, zinc as a p-type impurity (acceptor) is introduced from the vapor phase into the semiconductor solution 7, in an amount such as to compensate the donor of Te. The time from $t_4$ to $t_5$ is the zinc addition and subsequent aging time. Then, for a time period of $\tau_4$ from the time $t_5$ to the time $t_6$, the substrate is cooled to $T_3 = 800°$ C. thereby forming a second epitaxial growth layer of p-type conductivity on the aforementioned first epitaxial growth layer of n-type conductivity.

A light emitting diode produced in accordance with the abovementioned conventional single tub process contains impurities Te and N in its n-type first epitaxial layer and Te and Zn in its p-type second epitaxial layer. The light output of such a light emitting diode is low, its efficiency is as low as 0.05 to 0.1% due to the high impurity concentration as a result of the compensation in the p-type epitaxial layer.

As has been described, the conventional methods of liquid phase growth have the problems of lacking economical mass-productivity and in inferior product characteristics.

SUMMARY OF THE INVENTION

The present invention can solve the problems in liquid phase epitaxial growth methods and can provide an improved method which is suitable for economical mass-productivity. The process of the present invention comprises an evacuation step after a first epitaxial growth to form a first epitaxial layer comprising a first impurity, and thereafter, with or without introducing a second impurity of opposite conductivity type to that of the first impurity and other additive, a second epitaxial growth is made. By utilizing the present invention, the concentration of the second impurity is made low and efficiency of the light emission is improved.

DESCRIPTION OF THE PREFERRED EMBODIMENT

Figure 4:
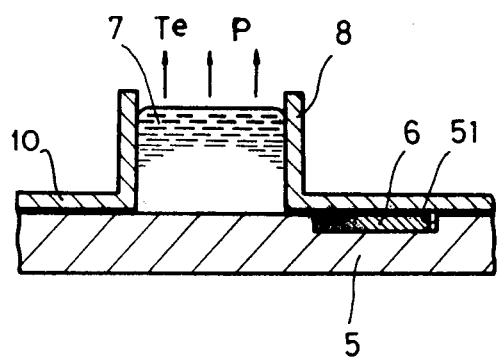
FIG. 4 is a cross-sectional view of an example of an apparatus used in a method embodying the present invention.

FIG. 4 shows an apparatus for epitaxial growth in accordance with the present invention. In the apparatus of FIG. 4, a slider 10 having a single tub 8 is slidably disposed on a holder 5, which has a recess 51 for holding a semiconductor substrate 6 therein. The tub 8 contains a solution 7. The solution is prepared by placing the following materials in the tub 8:

Ga (as solvent): 10 g
GaP (polycrystalline; as solute): 350 mg
Te (as impurity of n-type conductivity): 100 μg.

Figure 5:
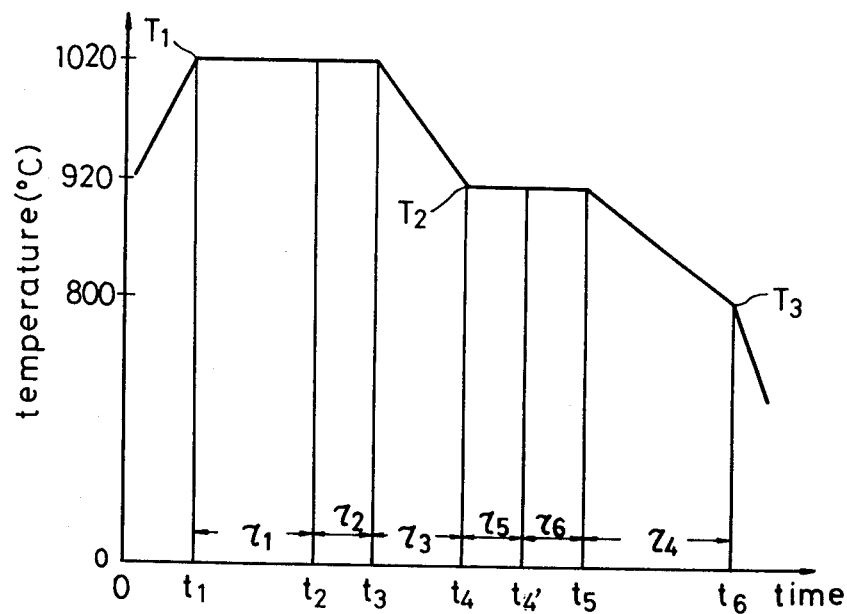
FIG. 5 is a time chart showing temperature changes of a semiconductor substrate and a solution in the epitaxial growth using the apparatus of FIG. 4 according to the present invention.

The abovementioned materials are preliminarily heated in the tub 8 at the position as shown in FIG. 4 to the temperature of $T_1=1020°$ C. for the time period of $\tau_1=30$ min., namely from the time $t_1$ to the time $t_2$ as shown in FIG. 5, so that the materials sufficiently dissolve in the solution. Nitrogen gas, as a recombination center, is introduced from a carrier gas comprising $NH_3$ and $H_2$ from the time $t_1$ on. After the preliminary heating of the solution for the time period of $\tau_1$, the solution is made to contact a GaP substrate 6 from the time $t_2$ to the time $t_3$, namely for $\tau_2=20$ min., by sliding the slider 10 to the right. Then the substrate and the solution are cooled at a predetermined cooling rate from the time $t_3$ to the time $t_4$, namely for the time period of $\tau_3=25$ min. down to the temperature of $T_2=920°$ C., thereby growing a first epitaxial growth layer having n-type conductivity. A characteristic step of the present invention is to stop the feeding of the $NH_3$ doping gas $H_2$ and carrier gas, after the completion of forming the n-type first epitaxial layer. That is, the substrate 6 is made isolated from the solution 7 by moving the slider again to the position shown in FIG. 4. Then, for the time period of $\tau_5=30$ to 40 min., namely from the time $t_4$ to the time $t_4'$, the container enclosing the system of FIG. 4 (not shown) is evacuated by a vacuum means while keeping the temperature of the system at about 920° C. By means of this evacuation, the n-type impurity Te and further P evaporate from the solution 7 as shown in FIG. 4, thereby reducing the concentration of Te to a negligibly small amount.

After reducing the contents of Te by the evaporation, a mixed gas comprising $NH_3$, Zn (vaporized by heating over 650° C., as p-type impurity) and argon-diluted phosphine with $H_2$ as carrier is introduced to the container. The mixed gas dissolves into the solution 7. The semiconductor substrate 6 is subsequently made to contact the solution 7 at the time $t_4'$ by moving the tub 8 onto the substrate 6. The system containing the substrate and the solution is kept at 920° C. for an additional time period of $\tau_6=20$ min., namely from $t_4'$ to $t_5$. Then, from the time $t_5$, the system is cooled for the time period of $\tau_4=60$ min., namely from the time $t_5$ to the time $t_6$, at a predetermined cooling rate, to the temperature of $T_3=800°$ C., thereby forming a second epitaxial layer of p-type conductivity. After the time $t_6$, the solution 7 is isolated from the substrate 6 and the entire epitaxial growth process is completed.

Figure 1:
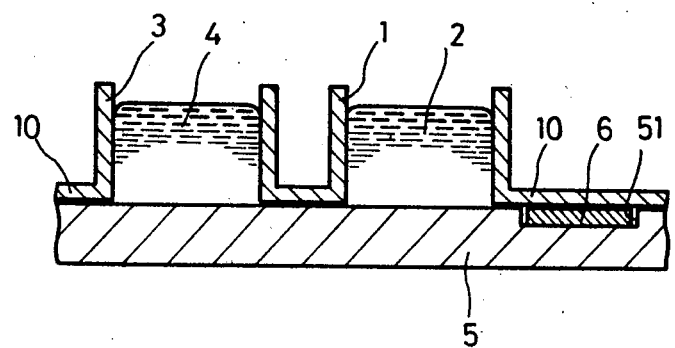
FIG. 1 is a cross-sectional elevation view of the example of a conventional apparatus for epitaxial growth with two solution tubs.
Figure 2:
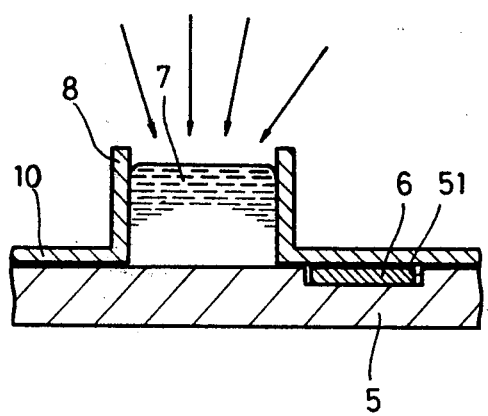
FIG. 2 is a cross-sectional elevation view of the example of a conventional apparatus for epitaxial growth with one solution tub.
Figure 3:
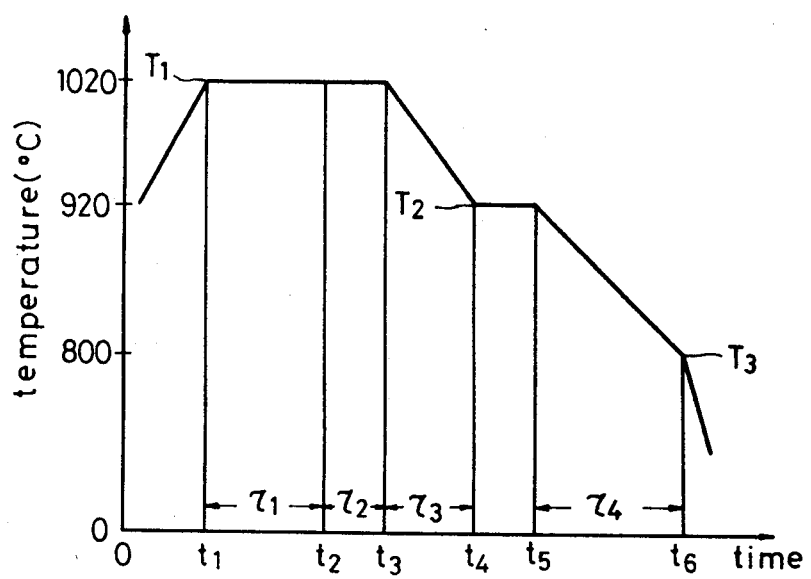
FIG. 3 is the time chart showing temperature changes of the semiconductor substrate and the solution in the conventional epitaxial growth using the apparatus of FIG. 2.
Figure 6:
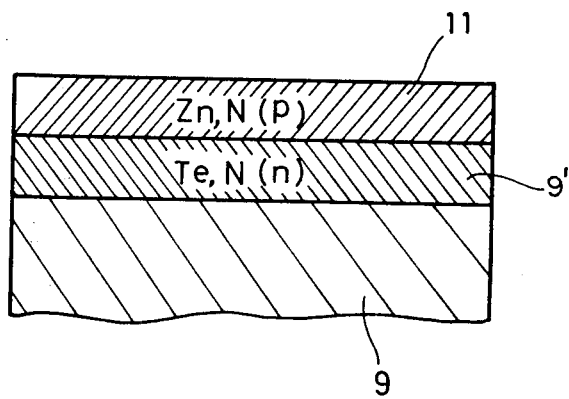
FIG. 6 is a sectional elevation view of a semiconductor device made by the liquid phase epitaxial growth method in accordance with the present invention.

FIG. 6 shows a schematic sectional view of the substrate, where a first epitaxial layer 9 of n-type conductivity, containing Te as impurity and N as recombination center, and a second epitaxial layer 11 of p-type conductivity, containing Zn as impurity and N as recombination center, are formed on a III-V compound semiconductor 9. The second epitaxial layer 11 made in accordance with the present invention substantially comprises only one kind of impurity, namely, only Zn in the example of FIG. 6. In other words, the second epitaxial layer 11 does not have substantial Te, and only Zn is contained as impurity. Therefore, there is no need for compensating Te with Zn in the second epitaxial layer 11, and hence the concentration of the impurity is drastically low in comparison with the second epitaxial layer made by the conventional method. Due to such a low concentration of the dopant impurity in the second epitaxial layer 11, the emission efficiency of a green light emitting diode made in accordance with the abovementioned apparatus and method is as high as 0.1 to 0.15%, in comparison with 0.05 to 0.1% for the conventional device made by the conventional method elucidated referring to FIG. 3.

As has been described above, the present invention can provide sequentially grown epitaxial layers wherein in the second epitaxial layers no impurity compensation is made even utilizing an apparatus with a single solution tub. Therefore, although utilizing a single tub manufacturing apparatus, it is possible according to our invention to control impurity concentrations of both the first and the second layers independently of each other, and by making the concentration of the second layers low, thereby improve the characteristics of the resultant semiconductor devices.

Furthermore, since only one tub is used in the manufacturing apparatus, only a small amount of the semiconductor solution is required, and also, mass-productivity and economic performance of the manufacturing method is substantial.

In the abovementioned example, two epitaxial layers 9 and 11 are of a conductivity type different from each other. By dispensing with the addition of Zn during the time period of $\tau_6$ (after evacuation to remove the first impurity), double epitaxial layers comprising different concentrations and the same kind of impurity can be made. In such a case, the impurity concentration of the overriding second epitaxial layer 11 can be controlled by adjusting the length of time of evacuation and original impurity concentration of the solution 7.

The present invention can be applied not only to the manufacture of devices having two epitaxial layers on a substrate, but also to devices having three or more epitaxial layers on a substrate.

The present invention is applicable not only to devices mainly comprising GaP layers, as aforementioned, but also to any devices such as those comprising GaAs layers or GaAlAs layers.

What is claimed is:

1. A method of growing semiconductor epitaxial layers on a substrate in an enclosed space, said method comprising the successive steps of:
   (a) forming a first epitaxial layer on said substrate by contacting a solution of a solvent, a solute and an impurity that determines the conductivity type with said semiconductor substrate for a predetermined period of time until a first epitaxial layer of the desired conductivity type is grown on said substrate;
   (b) evacuating the space in which said semiconductor substrate and said solution are contained and removing at least a portion of said impurity from the solution of step (a); and thereafter
   (c) forming a second epitaxial layer on the first epitaxial layer formed in step (a) by contacting the impurity-depleted solution from step (b) with the first-formed epitaxial layer on said substrate for a predetermined period of time until a second epitaxial layer is formed on said first epitaxial layer.

2. The method according to claim 1 wherein a second impurity of the opposite type as contained in the solution of step (a) is added to the solution prior to step (c), the second epitaxial layer formed in step (c) is of a conductivity type opposite to that of said first epitaxial layer.

3. The method according to claim 1 wherein an amount of impurity is removed in step (b) such that the amount of said impurity contained in the first epitaxial layer is greater than the second epitaxial layer.

4. The method according to claim 1 wherein an additional quantity of at least one element contained in the solute of step (a) and evaporated in step (b) is added to the solution used in step (c).

* * * * *